(12) United States Patent
Lau et al.

(10) Patent No.: US 8,778,704 B1
(45) Date of Patent: Jul. 15, 2014

(54) SOLAR POWERED IC CHIP

(71) Applicants: Teck Beng Lau, Petaling Jaya (MY); Wai Yew Lo, Petaling Jaya (MY); Chin Teck Siong, Shah Alam (MY)

(72) Inventors: Teck Beng Lau, Petaling Jaya (MY); Wai Yew Lo, Petaling Jaya (MY); Chin Teck Siong, Shah Alam (MY)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 13/849,543

(22) Filed: Mar. 24, 2013

Related U.S. Application Data

(63) Continuation-in-part of application No. 13/766,771, filed on Feb. 13, 2013.

(51) Int. Cl.
*H01L 21/00* (2006.01)
*H01L 25/16* (2006.01)

(52) U.S. Cl.
CPC .................................. *H01L 25/167* (2013.01)
USPC ................................ 438/19; 438/51; 257/434

(58) Field of Classification Search
CPC ........ H01L 33/62; H01L 31/073; H01L 33/40; H01G 9/025
USPC ........................ 438/19, 51; 257/434, E25.028
See application file for complete search history.

(56) References Cited

U.S. PATENT DOCUMENTS

| | | | |
|---|---|---|---|
| 4,970,453 A | 11/1990 | Oogita | |
| 5,150,193 A * | 9/1992 | Yasuhara et al. | 257/669 |
| 6,333,522 B1 * | 12/2001 | Inoue et al. | 257/99 |
| 6,476,474 B1 | 11/2002 | Hung | |
| 6,900,531 B2 | 5/2005 | Foong | |
| 7,605,476 B2 | 10/2009 | Gritti | |
| 2005/0104168 A1 | 5/2005 | Choi | |
| 2007/0087230 A1 * | 4/2007 | Jenson et al. | 429/7 |
| 2007/0090387 A1 | 4/2007 | Daniels | |
| 2008/0121947 A1 | 5/2008 | Frahm | |
| 2010/0148293 A1 | 6/2010 | Jain | |
| 2010/0234527 A1 * | 9/2010 | Ota et al. | 524/853 |
| 2011/0012253 A1 | 1/2011 | Kwang | |
| 2011/0169554 A1 | 7/2011 | Keysar | |
| 2012/0025982 A1 * | 2/2012 | McCain | 340/540 |
| 2012/0234922 A1 | 9/2012 | Sample | |
| 2013/0009851 A1 | 1/2013 | Danesh | |

* cited by examiner

*Primary Examiner* — Caridad Everhart
(74) *Attorney, Agent, or Firm* — Charles Bergere

(57) ABSTRACT

A self-powered integrated circuit (IC) device includes a lead frame and a solar cell having first and second main surfaces. The solar cell is mounted on a surface of the lead frame. An IC chip is also provided. A first electrical interconnector electrically couples the IC chip to the lead frame and a second electrical interconnector electrically couples the solar cell to the IC chip. A portion of the first main surface of the solar cell is configured to receive light from an external source. The solar cell converts energy of the received light into electrical power that is supplied to the IC chip. A mold compound encapsulates the IC chip, the first and second electrical interconnectors, and at least a portion of the solar cell.

19 Claims, 5 Drawing Sheets

SOLAR POWERED IC CHIP

CROSS-REFERENCE TO RELATED APPLICAITONS

This invention is a continuation-in-part of U.S. patent application Ser. No. 13/766,771 filed on Feb. 13, 2013 and assigned to Freescale Semiconductor, Inc.

BACKGROUND OF THE INVENTION

The present invention is directed to an integrated circuit package and a method of making integrated circuit packages that are self-powered through the use of an integral solar cell.

As wafer technology has advanced, the size and power requirements of integrated circuit (IC) chips have decreased. For example, ball grid array (BGA) packages are widely used in mobile devices because they are very small and have low power requirements. However, the power supplied to the IC chip conventionally comes from an external power source, such as a battery. Thus, placement of the IC chip must always be carefully considered so that the IC chip can be adequately accessed for coupling with the external power source. This makes the embedding of IC chips in items such as clothes, shoes, bicycles, the human body, or the like very difficult.

At the same time, the efficiency of solar cells has continued to improve. Specifically, in optimum conditions, the light-receiving surface area of a solar cell that is required to generate power has decreased. It has been found that a solar cell sized at about the same order of magnitude as an IC chip can be efficient enough to meet the power demand of such IC chip in low power environments.

It is therefore desirable to provide an IC chip package that has an integral solar cell in order to reduce or eliminate the need for the IC chip to rely on an external power source.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings:

FIGS. 5A1 and 5A2 are a bottom plan view and a top plan view of a solar cell wafer and encapsulant for lamination thereon;

DETAILED DESCRIPTION OF THE INVENTION

In one embodiment, the present invention provides a self-powered integrated circuit (IC) device. The devices includes a lead frame having opposing first and second main surfaces, a chip support area and a plurality of leads surrounding the chip support area. A solar cell has opposing first and second main surfaces, where at least a portion of the first main surface is configured to receive light from an external source and the second main surface of the solar cell is attached to the chip support area of the first main surface of the lead frame. The solar cell converts energy of the received light into electrical power. An integrated circuit (IC) chip has opposing first and second main surfaces, where the first main surface of the IC chip is in facing arrangement with the second main surface of the solar cell. The IC chip is electrically connected to the solar cell to receive the electrical power generated by the solar cell. In one embodiment, the solar cell is electrically connected to the IC chip with bond wires and in another embodiment, with solder balls. The IC chip also is electrically connected to the leads of the lead frame, in one embodiment with bond wires and in another embodiment with solder balls. At least a portion of the lead frame, the IC chip, the electrical connections between the IC chip and the solar cell and the IC chip and the leads, and at least a portion of the solar cell are encapsulated with a mold compound.

Figure 1:
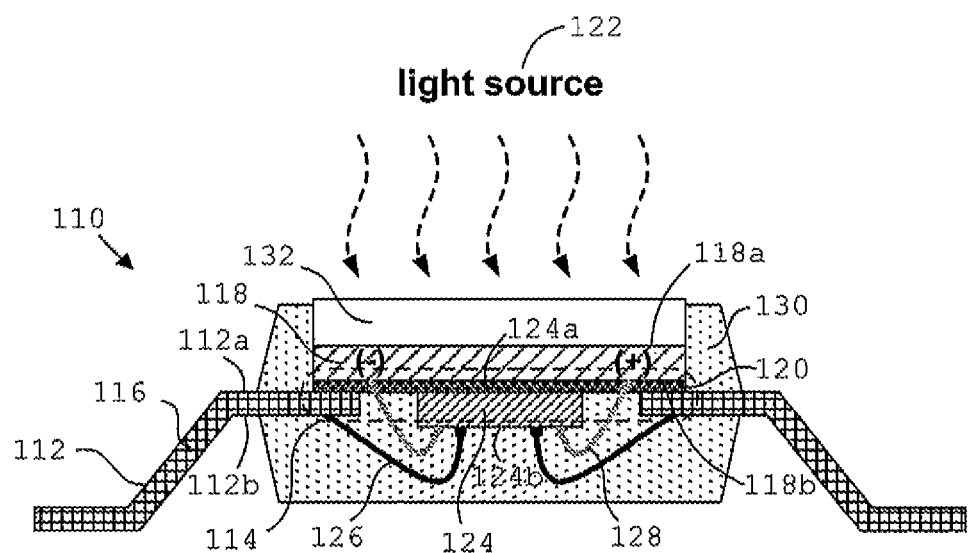
FIG. 1 is a cross-sectional side elevational view of an integrated circuit device in accordance with a first embodiment of the invention.

Referring now to the drawings, wherein the same reference numerals are used to designate the same components throughout the several figures, there is shown in FIG. 1 a first embodiment of a self-powered integrated circuit device 110 in accordance with the invention.

The self-powered integrated circuit device 110 includes a lead frame 112 having opposing first and second main surfaces 112a and 112b, a chip support area 114 and a plurality of leads 116 surrounding the chip support area 114. In this embodiment, the lead frame 112 is formed from a sheet of conductive metal or foil, such as copper, and comprises the plurality of leads 116 which surround a center opening. The chip support area 114 comprises a proximal end of the leads 114 and the opposing distal ends of the leads 116 allow for external electrical connection to an IC chip, as will be described below. The leads 116 may include one or more bends such as to form a gull wing shape as shown.

A solar cell 118 having opposing first and second main surfaces 118a and 118b is mounted to the chip support area 114 of the lead frame 112. That is, the second main surface 118b of the solar cell 118 is attached to the chip support area 114 of the first main surface 112a of the lead frame 112. In a preferred embodiment, the solar cell 118 is attached to the lead frame 112 with non-conductive epoxy 120 to avoid shorting metal traces (not shown) on the second main surface 118b of the solar cell 118.

The first main surface 118a is a light receiving side of the solar cell 118. At least a portion of the first main surface 118a of the solar cell 118 is configured to receive light from an external source 122. As is well known, the solar cell 118 converts energy of the received light into electrical power.

The solar cell 118 may be conventional, and is formed of monocrystalline, polycrystalline, or amorphous silicon or another like semiconductor material or combination thereof appropriately doped for efficient light absorption and subsequent separation and conduction of charge carriers. The solar cell 118 may also include surface conductive traces, anti-reflection coatings, metal contact pads, and other features as are conventionally known.

An integrated circuit (IC) chip 124 is also provided as part of the device 110. The IC chip 124 preferably includes opposing first and second main surfaces 124a, 124b. In this first embodiment, the first main surface 124a of the IC chip 124 is in facing arrangement with and attached to the second main surface 118a of the solar cell 118 at the center opening of the lead frame 112. A surface area of the first main surface 118a of the solar cell 118 is preferably larger than a surface area of the first main surface 124a of the IC chip 124. In a preferred embodiment, the IC chip 124 is attached to the solar cell 118 with non-conductive epoxy, such as the non-conductive epoxy 120 used to attach the solar cell 118 to the lead frame 112, to avoid shorting metal traces (not shown) on the second main surface 118b of the solar cell 118. At least one first electrical interconnector 126 electrically connects the leads 116 of the lead frame 112 with the IC chip 124. It is preferred that the at least first electrical interconnector 126 comprises a plurality of bond wires, which may be attached to bonding pads on the second surface 124b of the IC chip 124 and the proximal ends of the leads 116 on the second side 112b of the lead frame 112 using a conventional wire bonding process and wire bonding equipment.

The IC chip 124 also is electrically connected to the solar cell 118 to receive the electrical power generated by the solar cell 118. In a preferred embodiment, a plurality of second electrical interconnectors 128 electrically couple the solar cell 118 to the first main surface 124a of the IC chip 124. In a further preferred embodiment, the second electrical interconnectors 128 comprise bond wires, which may be attached to chip bonding pads and solar cell bonding pads using a conventional wire bonding process and convention wire bonding equipment.

The device 110 further includes a first encapsulant 130 that covers the IC chip 124, the first and second electrical interconnectors 126, 128, and portions of the lead frame 112 (i.e., the proximal ends of the leads 116) as is conventionally known. The first encapsulant 130 further covers at least a portion of the solar cell 118. The first encapsulant 130 may be made from a ceramic material, a polymeric material, or the like, as are known in the art.

In the first embodiment shown in FIG. 1, the first main surface 118a of the solar cell 118 is not covered the first encapsulant 130, and is therefore exposed. Since mold compounds (i.e., the first encapsulant 130) are often opaque to wavelengths of the light used by the solar cell 118 to generate power, this configuration allows the first main surface 118a of the solar cell 118 to have exposure to the light from the external source 122.

In FIG. 1, the IC device 110 further comprises a second encapsulant 132 laminated on at least the light receiving portion of the first main surface 118a of the solar cell 118. The second encapsulant 132 is transparent or transmissive to at least a wavelength of the received light so that the received light can be converted to electrical power by the solar cell 118. In a further preferred embodiment, the laminated portion of the first main surface 118a of the solar cell 118 is also laminated with glass (not shown). It is preferred that at least the laminated portion of the first main surface 118a of the solar cell 118 is exposed through the first encapsulant 130. With the presence of the second encapsulant 132, the first main surface 118a of the solar cell 118 is protected, and does not require the first encapsulant 130 for this purpose.

Figure 2:
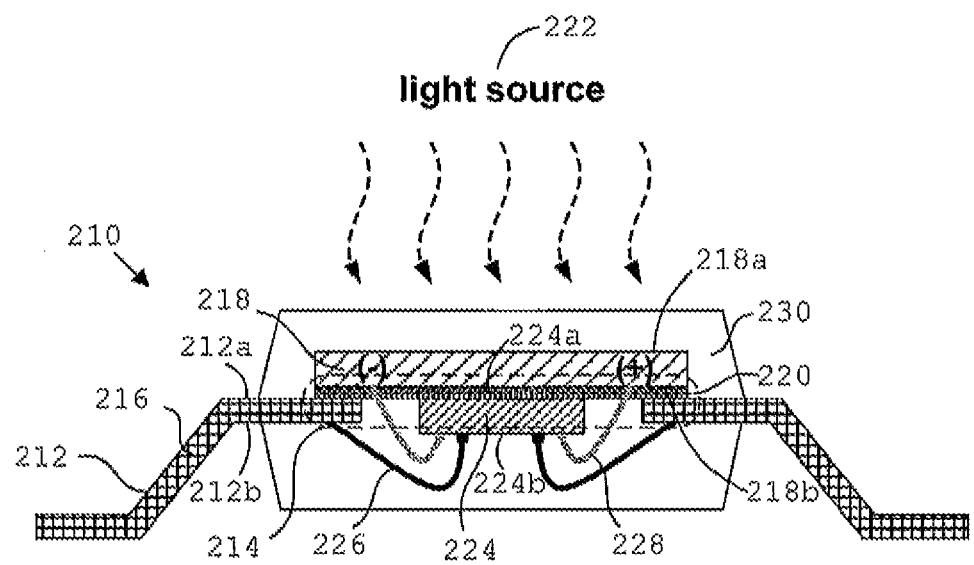
FIG. 2 is a cross-sectional side elevational view of an integrated circuit package in accordance with a second embodiment of the invention.

FIG. 2 shows a second embodiment of a device 210 in accordance with the invention. The second embodiment is similar to the first embodiment described above. Like numerals have been used for like elements, except the 200 series numerals have been used for the second embodiment. Accordingly, a complete description of the second embodiment has been omitted, with only the differences being described.

The second embodiment differs from the first embodiment in that the first encapsulant 230 is preferably transparent or transmissive to at least a wavelength of light received by the solar cell 218 from the external source 222. Thus, the second embodiment does not require a second encapsulant like the second encapsulant 132 of the first embodiment.

Figure 3:
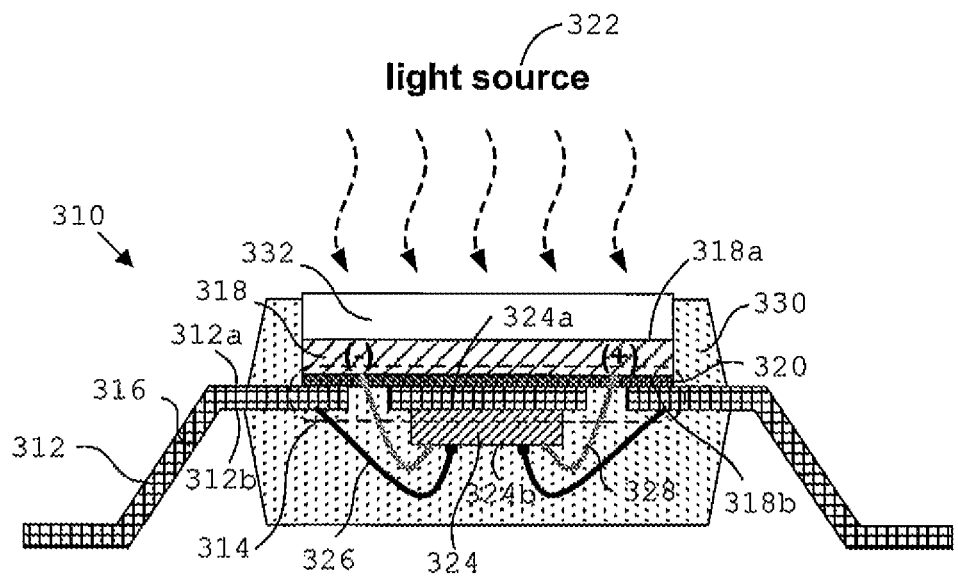
FIG. 3 is a cross-sectional side elevational view of an integrated circuit package in accordance with a third embodiment of the invention.

FIG. 3 shows a third embodiment of a package 310 in accordance with the invention. The third embodiment is similar to the first embodiment described above. Like numerals have been used for like elements, except the 300 series numerals have been used for the third embodiment. Accordingly, a complete description of the third embodiment has been omitted, with only the differences being described.

The third embodiment differs from the first embodiment in that the lead frame 112 includes a die pad or flag at the center opening thereof. The second main surface 118b of the solar cell 118 is attached to a first side of the die pad as well as the first sides of the proximal ends of the leads 116. Then the IC chip 324 is attached to the second side 112b of the die pad instead of being attached directly to the second main surface 118b of the solar cell 118.

Figure 4:
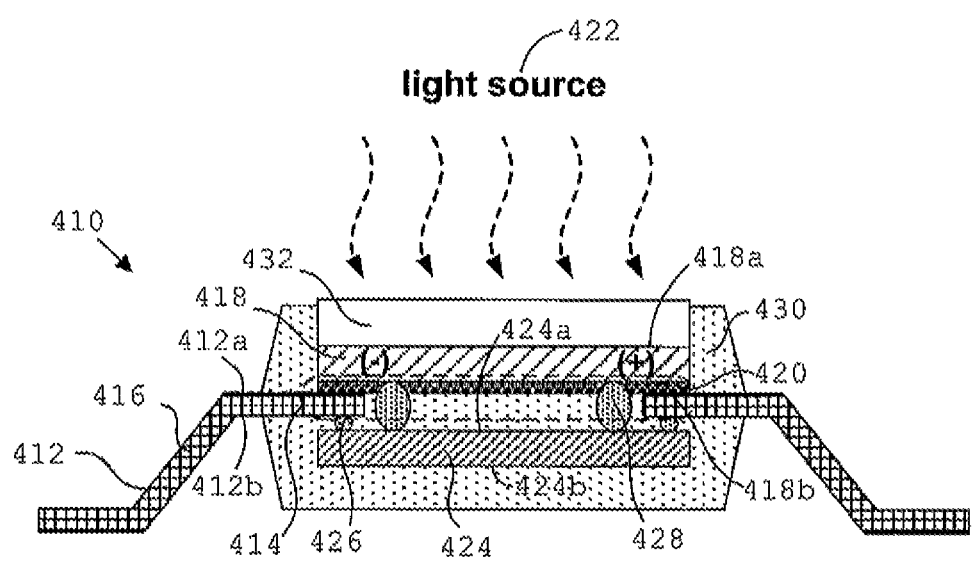
FIG. 4 is a cross-sectional side elevational view of an integrated circuit package in accordance with a fourth embodiment of the invention.

FIG. 4 shows a fourth embodiment of a packaged device 410 in accordance with the invention. The fourth embodiment is similar to the first embodiment described above. Like numerals have been used for like elements, except the 400 series numerals have been used for the third embodiment. Accordingly, a complete description of the third embodiment has been omitted, with only the differences being described.

The fourth embodiment of the present invention differs from the first embodiment in that the IC chip 424 is a flip-chip type die and the first electrical interconnectors 426 that electrically connect the IC chip 412 to the lead frame 412 comprise conductive balls or bumps. Further, the IC chip 424 is electrically connected to the solar cell 118 with second electrical interconnectors 428 that also comprise conductive balls or bumps. The first electrical interconnectors 426 have a bump diameter typically of about 0.25 to 0.75 times the lead width to allow reasonable tolerance for the pick and place machine used in the assembly process, and the second electrical interconnectors 428 have a bump diameter that is about 1.0 to 2.0 times its height, which is dependent on the total height or thickness of the lead frame (substrate), non conductive epoxy and interconnects 426.

In the fourth embodiment, the surface area of the first main surface 418a of the solar cell 418 and the surface area of the first main surface 424a of the IC chip 424 preferably are the same since the solar cell 418 and the IC chip 424 both are attached to the proximal ends of the leads 416 albeit on opposing sides, which make up the chip support area 414.

With a device 110, 210, 310, 410 according to embodiments of the present invention, the power requirements of the IC chip 124, 224, 324, 424 can at least partially be met by the power output by the solar cell 118, 218, 318, 418 contained within the device 110, 210, 310, 410. Thus, the need for connection to an external power supply can be reduced, if not eliminated.

Referring now to FIGS. 5A1-5H, an exemplary method for assembling a self-powered integrated circuit (IC) device in accordance with the first embodiment of the invention will now be described.

In FIG. 5A1, a solar cell wafer 50 is provided having a plurality of individual solar cells 118 formed thereon. One or more sheets of the encapsulant 132 are preferably laminated to a first main surface (not shown) of the solar cell wafer 50.

Solder pads 52 and metal traces 54 are located on the second main surface 50b of the solar cell wafer 50. FIG. 5A2 shows the first main surface 50a of the solar cell wafer 50 being preferably laminated with one or more sheets of the encapsulant 132.

Figure 5B:
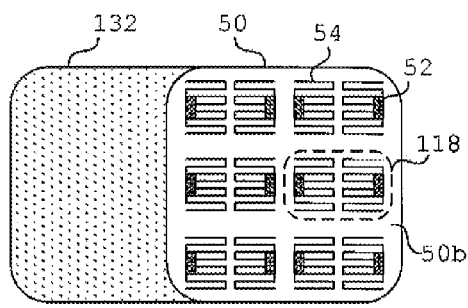
FIG. 5B is a bottom plan view of the wafer of FIGS. 5A1 and 5A2 prior to separation of individual solar cells therefrom.
Figure 5B:
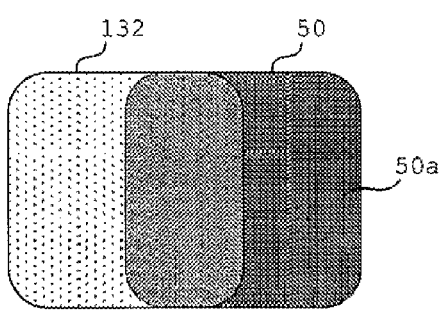
Figure 5B:
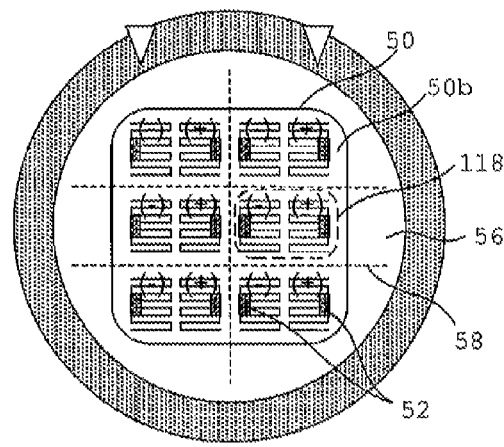

In FIG. 5B, after the solar cells 118 are ready for singulation, the solar cell wafer 50 is preferably mounted onto conventional dicing tape 56 with the second main surface 50b of the wafer 50 facing outward. The individual solar cells 118 are then separated from the wafer 50 preferably using a saw (not shown) to sever the solar cells 118 along the dotted singulation lines 58. However, other methods of singulation, such as punch singulation or the like may be used as well. In the embodiment shown, the severed solar cells 118 each include two solder pads 52 working as a positive pole and a negative pole respectively.

Figure 5C:
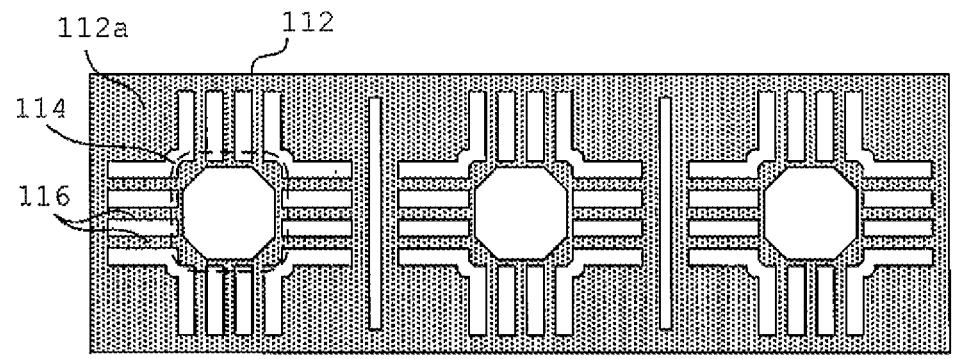
FIGS. 5C-5H are a series of diagrams illustrating steps in assembling a self-powered integrated circuit (IC) device in accordance with an embodiment of the present invention.

Referring to FIG. 5C, at least one lead frame 112 is provided having opposing first main surface 112a facing up and second main surface (not shown), a chip support area 114 and a plurality of leads 116 surrounding the chip support area 114.

Figure 5D:
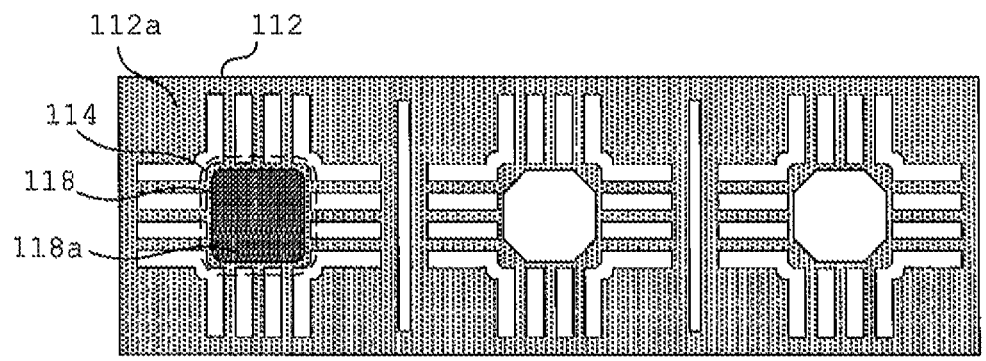

In FIG. 5D, a singulated solar cell 118 is mounted to the lead frame 112 with the first main surface 118a of the solar cell 118 facing up and the second main surface (not shown) of the solar cell 118 attached to the chip support area 114 of the first main surface 112a of the lead frame 112. As illustrated in FIG. 1, the solar cell 118 is preferably attached to the lead frame 112 with non-conductive epoxy 120 to avoid shorting metal traces (54 shown in FIG. 5A1) on the second main surface (50b shown in FIG. 5A1) of the solar cell 118.

Figure 5E:
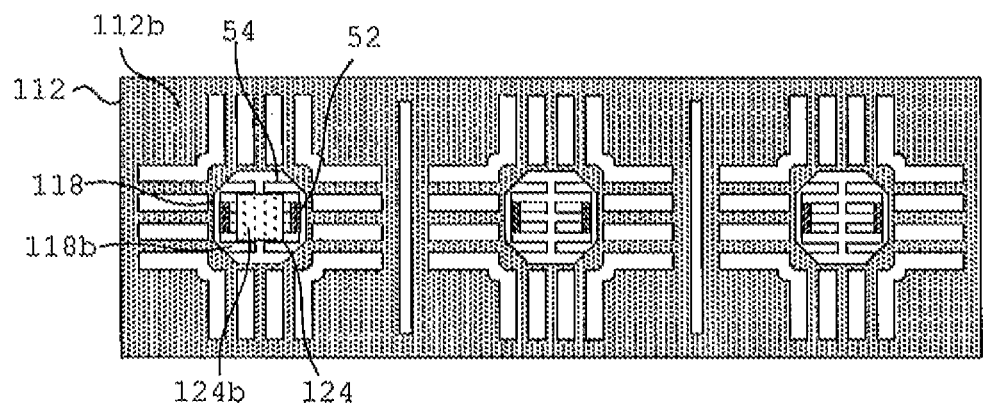

In FIG. 5E, the lead frame 112 is turned over with the second main surface 112b of the lead frame 112 facing up and placed onto a carrier (not shown). As illustrated in FIG. 5E, a center area of the chip support area 114 of the lead frame 112 is opening to expose the second main surface 118b of the solar cell 118 with solder pads 52 and metal traces 54. The first main surface (not shown) of the IC chip 124 is then being attached to the second main surface 118b of solar cell 118 preferably using non-conductive epoxy (not shown) to avoid shorting the metal traces 54.

Figure 5F:
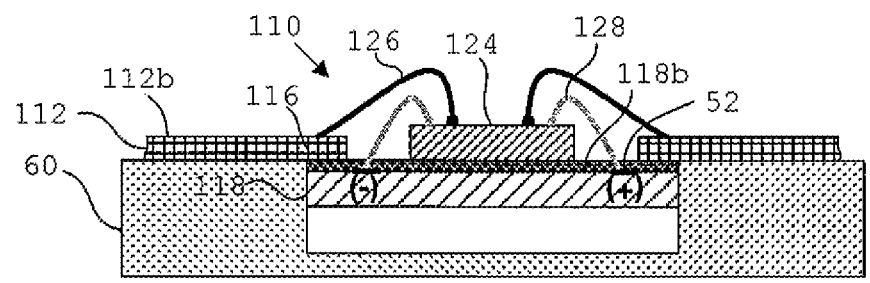
Figure 5G:
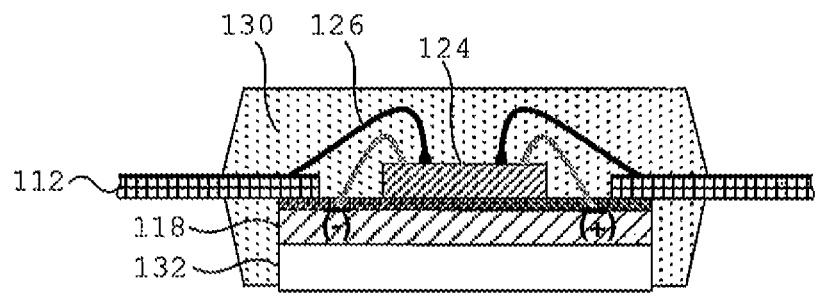
Figure 5H:
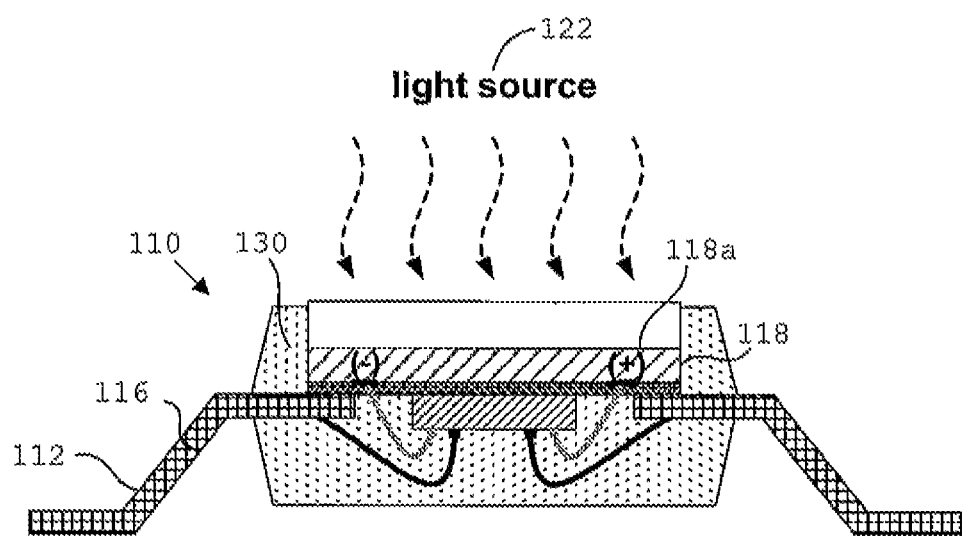

FIGS. 5F-5H are a series of enlarged cross-sectional views illustrating the rest steps in assembling the self-powered IC device 110.

FIG. 5F shows the partially assembled IC device 110 placed onto the carrier 60 with the second main surface 112b of the lead frame 112 facing up. Then the leads 116 of the lead frame 112 are electrically connected to the IC chip 124 with at least one first electrical interconnector 126. It is preferred that the at least first electrical interconnector 126 comprises a plurality of bond wires. In addition, the solder pads 52 on the second main surface 118b of the solar cell 118 are electrically coupled to the first main surface 124a of the IC chip 124 with a plurality of second electrical interconnectors 128. In a preferred embodiment, the second electrical interconnectors 128 comprise bond wires. The solder pads 52 act as a positive pole and a negative pole of the solar cell 118 respectively.

As illustrated in FIG. 5G, a first encapsulant 130 encapsulates the IC chip 124, the at least one first electrical interconnector 126, as is conventionally known. The first encapsulant 130 further encapsulates at least a portion of the solar cell 118 disposed on the lead frame 112 and at least a portion of the encapsulant 132 is exposed through the first encapsulant 130. The first encapsulant 130 may be made from a ceramic material, a polymeric material, or the like.

In FIG. 5H, once the first encapsulant 130 is set, the device 110 may be completed, as shown in FIG. 1, at least a portion of the first main surface 118a of the solar cell 118 is configured to receive light from an external source 122, the solar cell 118 converts energy of the received light into electrical power.

Clearly certain steps of the method may be altered and/or removed to form other embodiments of the device. As the second embodiment shown in FIG. 2, where the mold compound is transparent to the necessary wavelengths of light, the lamination step of the solar cell wafer can be omitted.

Similarly, if the center area of the chip support area of the lead frame is partially opening to expose a part of the second main surface of the solar cell with solder pads, the first main surface of the IC chip is attached on the second main surface of the lead frame rather than the second main surface of the solar cell as shown in the third embodiment in FIG. 3.

In addition, the step of electrically connecting the solar cell or the leads of the lead frame may, rather than wire bonding process, involve solder balls attachment and reflow process to achieve the configurations shown in the fourth embodiment in FIG. 4.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A self-powered integrated circuit (IC) device, comprising:
 a lead frame having opposing first and second main surfaces, a chip support area with a center opening and a plurality of leads surrounding the chip support area;

a solar cell having opposing first and second main surfaces, wherein at least a portion of the first main surface of the solar cell is configured to receive light from an external source and the second main surface of the solar cell is attached to the chip support area of the first main surface of the lead frame with a portion of the second main surface of the solar cell exposed through the center opening of the chip support area, wherein the solar cell converts energy of the received light into electrical power;

an integrated circuit (IC) chip having opposing first and second main surfaces, the first main surface of the IC chip being mounted on the second main surface of the solar cell through the center opening of the chip support area, wherein the IC chip is electrically connected to the solar cell through the center opening to receive the electrical power generated by the solar cell;

at least one first electrical interconnector electrically connecting the leads of the lead frame with the IC chip; and a first encapsulant that covers at least a portion of the lead frame, the IC chip, the at least one first electrical interconnector, and at least a portion of the solar cell.

2. The IC device of claim 1, wherein the first encapsulant is transparent or transmissive to at least a wavelength of the received light and the first main surface of the solar cell is encapsulated therewith.

3. The IC device of claim 1, wherein the first main surface of the IC chip is mounted on the second main surface of the solar cell with a non-conductive epoxy.

4. The IC device of claim 1, wherein the at least one first electrical interconnector comprises a plurality of bond wires.

5. The IC device of claim 1, wherein a surface area of the first main surface of the solar cell is larger than a surface area of the first main surface of the IC chip.

6. The IC device of claim 1, further comprising a second encapsulant laminated on at least the light receiving portion of the first main surface of the solar cell, wherein the second encapsulant is transparent or transmissive to at least a wavelength of the received light.

7. The IC device of claim 6, wherein the laminated portion of the first main surface of the solar cell is also laminated with glass.

8. The IC device of claim 6, wherein at least the laminated portion of the first main surface of the solar cell is exposed through the first encapsulant.

9. The IC device of claim 1, further comprising a plurality of second electrical interconnectors that electrically couple the solar cell to the second main surface of the IC chip.

10. The IC device of claim 9, wherein the second electrical interconnectors comprise bond wires.

11. A self-powered integrated circuit (IC) device, comprising:
a lead frame having opposing first and second main surfaces, a chip support area with a center opening and a plurality of leads surrounding the chip support area;

a solar cell having opposing first and second main surfaces, wherein the first main surface of the solar cell is configured to receive light from an external source and the second main surface of the solar cell is attached on the chip support area of the first surface of the lead frame with a portion of the second main surface of the solar cell exposed through the center opening of the chip support area, and wherein the solar cell converts energy of the received light into electrical power;

an integrated circuit (IC) chip having opposing first and second main surfaces, the first main surface of the IC chip being in facing arrangement with the second main surface of the solar cell and mounted on the chip support area of the second main surface of the lead frame and electrically connected to the leads of the lead frame with solder balls, and wherein a portion of the first main surface of the IC chip is exposed and electrically connected to the second main surface of the solar cell through the center opening to receive the electrical power generated by the solar cell; and a first encapsulant that covers the IC chip, and at least a portion of the solar cell.

12. The IC device of claim 11, wherein the first encapsulant is transparent or transmissive to at least a wavelength of the received light, and the first main surface of the solar cell is encapsulated therewith.

13. The IC device of claim 11, further comprising a second encapsulant laminated on at least the light receiving portion of the first main surface of the solar cell, wherein the second encapsulant is transparent or transmissive to at least a wavelength of the received light.

14. The IC device of claim 13, wherein the laminated portion of the first main surface of the solar cell is also laminated with glass.

15. The IC device of claim 14, wherein at least the laminated portion of the first main surface of the solar cell is exposed through the first encapsulant.

16. The IC device of claim 11, further comprising a plurality of electrical interconnectors that electrically couple the solar cell to the IC chip.

17. The IC device of claim 16, wherein the electrical interconnectors comprise solder balls.

18. A method of assembling a self-powered integrated circuit (IC) device, the method comprising:
mounting a solar cell having opposing first and second main surfaces on a chip support area of a first main surface of a lead frame, wherein the chip support area includes a center opening so that a portion of the second main surface of the solar cell is exposed through the center opening, and wherein at least a portion of the first main surface of the solar cell is configured to receive light from an external source, and wherein the solar cell converts received light to electrical power;

mounting an integrated circuit (IC) chip having opposing first and second main surfaces on the second main surface of the solar cell, wherein the first main surface of the IC chip is attached to the second main surface of the solar cell through the center opening of the chip support area;

electrically coupling, using at least one first electrical interconnector, the IC chip to a plurality leads of the lead frame;

electrically connecting the solar cell to the IC chip through the center opening of the chip support area so that that solar cell provides the electrical power to the IC chip; and encapsulating, in a mold compound, the IC chip, the at least one first electrical interconnector, at least a portion of the leads of the lead frame, and at least a portion of the solar cell.

19. The method of claim 18, further comprising laminating at least the light receiving portion of the first main surface of the solar cell with an encapsulant that is transparent or transmissive to at least a wavelength of the received light.

* * * * *